(12) United States Patent
Oman

(10) Patent No.: US 6,873,043 B2
(45) Date of Patent: Mar. 29, 2005

(54) ELECTRONIC ASSEMBLY HAVING ELECTRICALLY-ISOLATED HEAT-CONDUCTIVE STRUCTURE

(75) Inventor: Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 31 days.

(21) Appl. No.: 10/385,106

(22) Filed: Mar. 10, 2003

(65) Prior Publication Data

US 2004/0180474 A1 Sep. 16, 2004

(51) Int. Cl.$^7$ .............................................. H01L 23/36
(52) U.S. Cl. .................... 257/703; 257/706; 257/717; 257/E23.106; 361/707; 361/709
(58) Field of Search .............................. 257/703, 705, 257/706, 707, 717, E23.106; 361/707, 709, 710, 719; 438/122

(56) References Cited

U.S. PATENT DOCUMENTS

| | | | |
|---|---|---|---|
| 5,151,777 A | | 9/1992 | Akin et al. |
| 5,293,301 A | * | 3/1994 | Tanaka et al. ............... 361/707 |
| 5,395,679 A | | 3/1995 | Myers et al. |
| 5,577,656 A | * | 11/1996 | Temple et al. ........... 228/123.1 |
| 5,923,084 A | * | 7/1999 | Inoue et al. ................. 257/712 |
| 6,127,724 A | * | 10/2000 | DiStefano .................... 257/675 |
| 6,156,980 A | | 12/2000 | Peugh et al. ................. 174/252 |
| 6,180,045 B1 | | 1/2001 | Brandenburg et al. ...... 264/263 |
| 6,180,436 B1 | | 1/2001 | Koors et al. ................. 438/117 |
| 6,307,749 B1 | | 10/2001 | Daanen et al. ............... 361/704 |
| 6,365,964 B1 | | 4/2002 | Koors et al. ................. 257/718 |
| 6,424,529 B2 | | 7/2002 | Eesley et al. |
| 6,424,531 B1 | | 7/2002 | Bhatti et al. |
| 6,560,110 B1 | | 5/2003 | Myers et al. |
| 2004/0061221 A1 | * | 4/2004 | Schaffer ...................... 257/723 |

OTHER PUBLICATIONS

Christopher Schaeffer, "High Power MCM Package," U.S. Appl. No. 60/396,342 filed on Jul. 15, 2002.*
U.S. Appl. No. 60/396,342.*

* cited by examiner

Primary Examiner—Stephen W. Smoot
(74) Attorney, Agent, or Firm—Stefan V. Chmielewski

(57) ABSTRACT

An electronic assembly equipped with a heat-conductive structure, and to a method of conducting heat from a circuit device within such an assembly. The heat-conductive structure comprises an interconnect layer, a contact layer, and an electrically insulating layer between the interconnect and contact layers. The interconnect layer contacts circuit elements on the topside of the device, and comprises extensions that contact conductors on the substrate to which the device is attached. The interconnect and contact layers are both formed of thermally and electrically conductive materials, such that the heat-conductive structure electrically interconnects the topside of the device with the substrate and thermally interconnects the topside with a heat sink placed in contact with the contact layer. Because of the presence of the insulating layer, the heat sink does not interfere with the electrical connections provided by the interconnect layer.

17 Claims, 1 Drawing Sheet

ELECTRONIC ASSEMBLY HAVING ELECTRICALLY-ISOLATED HEAT-CONDUCTIVE STRUCTURE

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to thermal management of semiconductor devices. More particularly, this invention relates to a heat-conductive structure capable of conducting and dissipating heat from a semiconductor device that requires electrical connections to its backside (topside) and frontside (e.g., circuit-side) surfaces.

(2) Description of the Related Art

Semiconductor devices exist that require electrical connections to opposite sides of the device as well as thermal management through the use of a heat sink placed in thermal contact with the device. Devices with these requirements are typically power semiconductor devices, including field effect transistors (FET's), insulated gate bipolar transistors (IGBT's), and power flip chips. These devices are typically enclosed in semiconductor packages in which the device is mounted to a copper slug and overmolded. The overmolded package is then mounted to a substrate by either through-hole or surface-mount soldering processes. In order to decrease circuit board area and product cost, there is a desire in the electronics industry to "depackage" these devices. One such approach is to mount the bare chip directly to a substrate (direct chip attach, or DCA) with its active circuit side (frontside) facing away from the substrate to which the device is mounted, and then wire bonding the frontside of the chip to bond pads on the surrounding substrate.

A difficulty encountered with overmold-packaged and DCA wire-bonded power semiconductor devices is the inability to adequately heat sink from the topside of the device (the "topside" being the surface of the device facing away from the substrate). Topside heat sinking requires a low thermal resistance path that is electrically isolated from the circuitry on the device surface. One such method is disclosed in commonly-assigned U.S. Pat. Nos. 6,180,436 and 6,365,964 to Koors et al., and involves conducting heat from a power flip chip with a heat-conductive pedestal brought into thermal contact with the topside of the chip, i.e., the surface opposite the solder connections that attach the chip to its substrate. However, such an approach is not compatible with power devices requiring electrical connections to both the front and topsides of the chip. Packaged devices electrically isolate the topside circuitry, but the epoxy used for encapsulation has high thermal resistance. For DCA devices, the wire bonds interfere with the placement of a topside heat sink, and copper straps often used as the heat sink are not electrically isolated from the circuitry.

There are several additional disadvantages to using wire bonding to make the electrical connection from a power semiconductor device to the substrate on which it is mounted. Since these devices drive high current loads, they may require multiple wire bonds. However, as the number of wire bonds increases, device yield can drop to unacceptable levels. Considering that many applications have numerous FET's or IGBT's, the total system yield can be reduced further. In the particular case of FET and IGBT devices, the active circuit under the wire bond sites can be damaged during the bonding process, generating additional yield losses. Furthermore, the use of multiple wire bonds may yield higher then desired current densities at the bond sites, causing regional heating. From a process perspective, the wire bond process itself is expensive due to the equipment requirements and the serial nature of the process. Finally, the number of wire bonds required for an FET device is becoming a major driver for sizing such devices because of the amount of chip area needed to bond out the device. This issue becomes more of a problem as silicon technology improvements increase the power density capability, which drives smaller die sizes.

From the above, it can be seen that current approaches to thermal management of power devices have drawbacks that limit their application and/or effectiveness, particularly in the case of DCA wire-bonded devices.

BRIEF SUMMARY OF THE INVENTION

The present invention is directed to an electronic assembly equipped with a heat-conductive structure, and to a method of conducting heat from a circuit device within such an assembly. The heat-conductive structure enables the topside of a circuit device to be electrically connected to a substrate on which the device is mounted, while simultaneously electrically insulating the device from a heat sink that thermally contacts the topside of the device.

The electronic assembly of this invention generally includes a substrate having conductors thereon, a circuit device mounted to the substrate, and a heat-conductive structure contacting the substrate and the device. The device has oppositely-disposed first and second surfaces, with circuit elements on the first surface being electrically connected to a first set of the conductors on the substrate. The heat-conductive structure comprises an interconnect layer contacting circuit elements on the second surface of the device, a contact layer, and an electrically insulating layer between the interconnect and contact layers. The interconnect layer further comprises extensions that contact a second set of the conductors on the substrate. The interconnect and contact layers are both formed of thermally and electrically conductive materials, such that the heat-conductive structure electrically interconnects the circuit elements on the second surface of the device with the second set of the conductors on the substrate. Because of the presence of the insulating layer, the contact layer of the heat-conductive structure is thermally but not electrically connected to the second surface of the device. As such, a heat sink placed in contact with the contact surface of the heat-conductive structure is able to conduct heat away from the device without interfering with the electrical connections provided between the device and substrate by the interconnect layer.

In view of the above, the heat-conductive structure of this invention also provides a method of conducting heat from a circuit device of the type described above, namely, having oppositely-disposed first and second surfaces with circuit elements that require electrical connections to conductors on a substrate to which the device is mounted. The method involves placing the heat-conductive structure of this invention on the device so that the heat-conductive structure electrically interconnects the circuit elements on the second surface of the device with conductors on the substrate, while thermally but not electrically connecting the device to a heat sink placed against the heat-conductive structure.

According to an important aspect of the invention, the heat sink structure enables the topside of a power semiconductor device, such as an FET, IGBT or power flip chip, to be electrically connected to a substrate on which the device is mounted, while simultaneously electrically insulating the device from a heat sink that thermally contacts the topside of the device. The connections made by the heat-conductive structure between the second surface of the device and the second set of conductors on the substrate eliminate the need for wire bonding, which allows for the use of smaller and less expensive dies. Furthermore, the connections can be of sufficient quality to lower the $RDS_{on}$ value for the device.

Other objects and advantages of this invention will be better appreciated from the following detailed description.

DETAILED DESCRIPTION OF THE INVENTION

Figure 1:
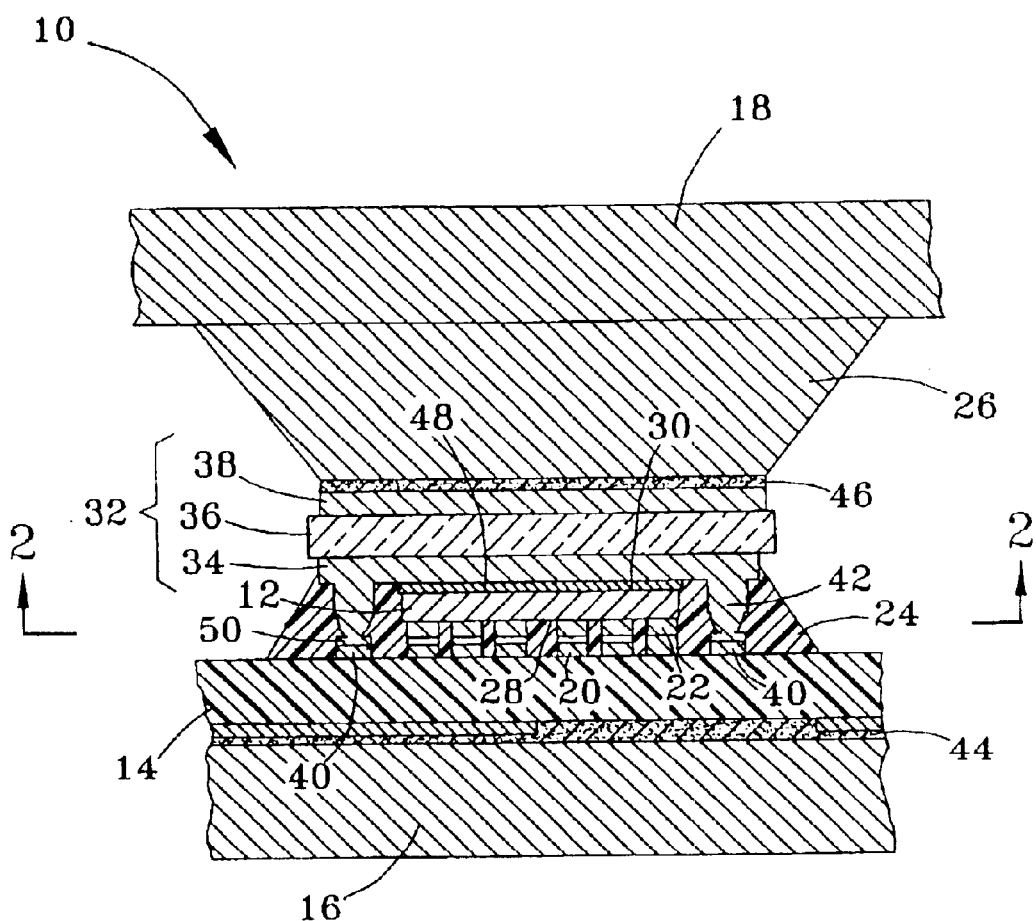
FIG. 1 is a cross sectional view of an electronic assembly equipped with a heat-conducting structure in accordance with this invention.
Figure 2:
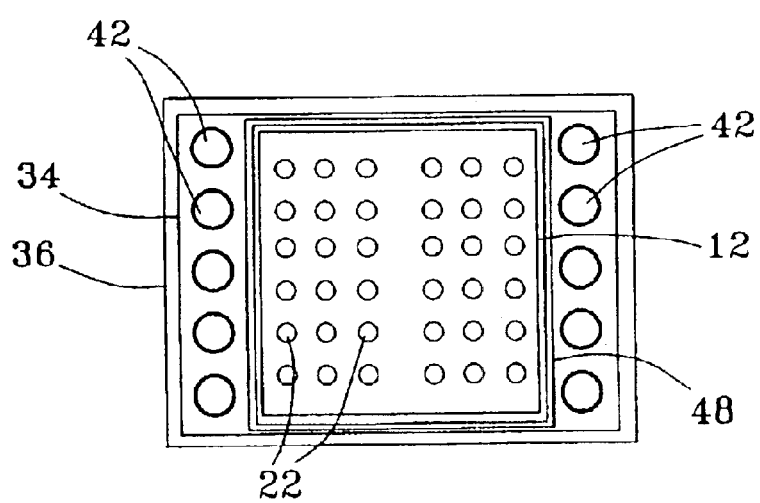
FIG. 2 is a cross sectional view taken along line 2—2 of FIG. 1.

FIGS. 1 and 2 represent an electronic assembly 10 comprising a power flip chip 12 mounted on a substrate 14, which may be a printed circuit board (PCB) or any other suitable substrate material or structure. The chip 12 is depicted as a semiconductor die having a frontside (lower surface in FIG. 1) 28 and an oppositely-disposed topside (upper surface in FIG. 1) 30. The chip 12 is mounted to the substrate 14 by a conventional flip-chip technique, in which bond pads or other suitable terminals (not shown) on the frontside 28 of the chip 12 are reflow soldered to conductors 20 on the surface of the substrate 14 to yield solder connections 22. The chip 12 is also shown as being underfilled with a suitable polymeric material 24, as is conventionally done in the art to promote the thermal cycle life of the solder connections 22. Finally, and according to a preferred aspect of the invention, the chip 12 has circuit elements, e.g., integrated circuitry, conductive traces, bond pads, etc, (not shown) on its topside 30 which also require electrical connections. Those skilled in the art will appreciate that while a power flip chip is represented in the Figures and will be discussed below, the invention can be utilized with a variety of circuit devices having multiple surfaces that require electrical connections.

As shown in FIG. 1, the assembly 10 includes a two-piece case 16 and 18 (of which only portions are shown) that enclose the flip chip 12 and substrate 14. The upper portion 18 of the case 16–18 is shown as comprising a heat sink 26 that extends toward the topside 30 of the chip 12. To facilitate manufacturing, the case portion 18 and heat sink 26 can be integrally formed as shown, such as by molding, stamping or forming a suitable thermally-conductive material, such as aluminum or another material having relatively high thermal conductivity and thermal mass. Alternatively, the heat sink 26 and case portion 18 can be formed separately and of different materials and then secured together, such as with an adhesive, in which case the case portions 16 and 18 can be formed of copper or another suitable packaging material known in the art.

As represented in FIG. 1, the assembly 10 further includes a heat-conducting laminate structure 32 positioned between the chip 12 and the heat sink 26. The laminate structure 32 is shown as comprising three discrete layers: an interconnect layer 34, an insulating layer 36, and a contact layer 38, which are preferably bonded or otherwise secured together so that the structure 32 is a unitary member. The interconnect layer 34 and the contact layer 38 define planar surfaces intended to interface with the topside 30 of the chip 12 and the heat sink 26, respectively. As will become evident from the following discussion, the primary role of the interconnect layer 34 is to provide electrical connection between the circuit elements on the topside 30 of the chip 12 to a second set of conductors 40 on the substrate 14, though in the preferred embodiment the interconnect layer 34 is also highly thermally conductive. In addition, the primary role of the contact layer 38 is to provide thermal coupling between the topside 30 of the chip 12 and the heat sink 26. For this purpose, both the interconnect and contact layers 34 and 38 can be formed of rectangular metal sheets, e.g., copper or copper alloy, both which are brazed or otherwise bonded to opposite surfaces of the insulating layer 36. A suitable thickness for the copper sheets is about 0.25 mm, though lesser and greater thicknesses are foreseeable. While copper and its alloys meet both the electrical and thermal conductivity requirements of the interconnect and contact layers 34 and 38, other materials having the desired physical properties could be used. Furthermore, while the interconnect and contact layers 34 and 38 are each shown as being formed by a single metal layer and the insulating layer 36 is shown as being formed by a single nonmetal layer, it is foreseeable that any or all of these layers 34, 36 and 38 could by built up of multiple layers or laminations of appropriate metal (electrically conductive) and nonmetal (dielectric) materials.

The primary role of the insulating layer 36 is to electrically insulate the interconnect layer 34 and the circuit elements on the topside 30 of the chip 12 from the contact layer 38 and heat sink 26. For this purpose, the insulating layer 36 can be formed of a variety of nonmetal materials, e.g., ceramics, of various thicknesses. Examples include an approximately 0.3 mm layer of silicon nitride ($Si_3N_4$) or an approximately 0.6 mm layer of aluminum nitride (AlN), though other materials and different thicknesses could also be employed. Depending on the physical properties of the insulating layer 36, the contact layer 38 may be required to prevent bowing of the insulating layer 36 during bonding of the layers 34, 36 and 38 to form the laminate structure 32.

Prior to assembling the laminate structure 32, the interconnect layer 34 can be formed, such as by stamping, to define a number of pedestals 42 that extend perpendicularly from the interconnect layer 34 toward the substrate 14. Alternatively, it may be more practical to form the pedestals 42 separately, such as in the form of copper balls which are then attached by brazing to the interconnect layer 34. The interconnect, insulating and contact layers 34, 36 and 38 are then assembled and bonded together, such as by brazing or adhesive bonding, to complete the laminate structure 32. Alternatively, the layers 34, 36 and 38 could be assembled within the case portion 16 and then bonded together with an adhesive.

A suitable process for assembling the electronic assembly 10 shown in FIG. 1 is to first reflow solder the chip 12 to the interconnect layer 34 using a suitable reflow solder technique, such that circuit elements on the topside 30 of the chip 12 are physically and electrically connected to the interconnect layer 34 of the laminate structure 32 with one or more solder connections 48. The subassembly comprising the chip 12 and laminate structure 32 can then be placed on the substrate 14. To form the required electrical connections between the conductors 20 and 40 and, respectively, the frontside 28 of the chip 12 and the pedestals 42 of the laminate structure 32, a solder paste is preferably printed on the conductors 20 and 40 prior to placement of the chip-laminate structure subassembly. With this approach, the solder paste is formulated to contain a solder alloy having a lower melting temperature than the solder used to attach the chip 12 to the laminate structure 32. Both the chip 12 and the pedestals 42 of the laminate structure 32 are then simultaneously reflow soldered to the conductors 20 and 40 on the substrate 14, thereby forming the chip solder connections 22 as well as pedestal solder connections 50 shown in FIG. 1. Alternatively, the chip 12 and laminate substrate 32 could be placed separately and then simultaneously reflow soldered to the substrate 14. For example, prior to attachment of the laminate structure 32 to the chip 12, solder bumps could be preformed on the chip 12 using any suitable bumping technique and a solder paste could be printed on the conductors 20 and 40 to form the solder connections 22 and 50, and the laminate structure 32 could be preplated with solder or a solder preform and fluxed to form the solder connections 48. After placement of the chip 12 followed by the laminate substrate 32, the chip 12 and laminate structure 32 would then be simultaneously reflow soldered to the substrate 14. After attachment of the chip 12 and laminate structure 32, the solder connections 22 of the chip 12 are preferably encapsulated with the underfill material 24, resulting in the encapsulation of the pedestal solder connections 50 and underfilling of the laminate structure 32.

The substrate-chip-laminate subassembly can then be placed on or within the case portion 16. Prior to placement, a thermally-conductive lubricant 44 is preferably placed within the case portion 16 to promote heat transfer with the substrate 14. The lubricant 44 also serves to decouple any lateral mechanical strains that may arise as a result of different thermal expansions and movement between the chip 12, substrate 14 and case portion 16. Various lubricants are known for this purpose, such as silicone greases. The upper case portion 18 is then placed on the lower case portion 16, so that the contact layer 38 of the laminate structure 32 thermally contacts the heat sink 26. As shown in FIG. 1, thermal contact between the laminate structure 32 and heat sink 26 can be made through a second layer of thermally-conductive lubricant 46 that serves to mechanically decouple the laminate structure 32 and heat sink 26.

From the above, it can be seen that the laminate structure 32 is capable of providing an excellent electrical path between the chip 12 and the conductors 40 on the substrate 14, as well as an excellent thermal path between the chip 12 and heat sink 26 and between the chip 12 and substrate 14, yet electrically insulates the circuitry on the chip 12 from the heat sink 26. As such, the laminate structure 32 is able to provide thermal management for circuit devices that require electrical connections to both sides of the device. The laminate structure 32 is also more closely matched to the coefficient of thermal expansion (CTE) of semiconductor materials (e.g., silicon) from which circuit devices are made, and therefore can reduce the stresses on the solder connections 22, 48 and 50. The laminate structure 32 of this invention offers various other advantages in terms of reliability. For example, the pedestals 42 can be formed to have a minimal footprint contact area on the surface of the substrate 14, while providing a two-sided contact for enhanced electrical performance and balanced thermal expansion characteristics. The multiple contact points provided by the pedestals 42 are also capable of reducing $RDS_{on}$ for improved electrical and thermal performance.

Furthermore, the large bond area between the chip 12 and interconnect layer 34 distributes current and heat better than wire bonds. As a result, the overall reliability of the chip 12 and assembly 10 is enhanced due to improved thermal performance. The laminate structure 32 is also able to improve the electrical performance of the chip 12 by reducing inductance as a result of the thin, flat shape of the interconnect layer 34 being oriented in parallel with the conductors 20 and 40 on the substrate 14. The interconnect and contact layers 34 and 38 also sufficiently surround the chip 12 to provide EMI shielding.

In addition to the above, the laminate structure 32 also provides a number of processing-related advantages. A primary processing advantage is the elimination of wire bonding to the topside 30 of the chip 12, reducing yield loss for single versus multiple bond processes and reducing process cycle time. In addition, since the laminate structure 32 has essentially the same form as a standard flip chip, handling and processing of the structure 32 can rely on standard assembly processes, resulting in less investment. For example, the structure 32 can be delivered according to standard die methods, such as tape/reel, waffle pack, etc. The structure 32 can be handled similarly to a standard flip chip as a preassembled unit (e.g., soldered, brazed or otherwise bonded together) or assembled on the substrate 14 with solder plated or dispensed on the interconnect layer 34 to later form the solder connections 48. The height of the solder connections 22 between the chip 12 and substrate 14 can be better controlled or at least made more consistent as a result of the pedestals 42. The laminate structure 32 also provides the option for electrically testing the chip 12 after chip singulation to detect leakages and perform high power tests.

While the invention has been described in terms of a preferred embodiment, it is apparent that other forms could be adopted by one skilled in the art. Accordingly, the scope of the invention is to be limited only by the following claims.

What is claimed is:

1. An electronic assembly comprising:
a substrate having conductors thereon;
a circuit device mounted to the substrate, the device having oppositely-disposed first and second surfaces with circuit elements thereon, the circuit elements on the first surface of the device being electrically connected to a first set of the conductors on the substrate; and
a heat-conductive structure contacting the substrate and the second surface of the device, the heat-conductive structure comprising an interconnect layer contacting at least some of the circuit elements on the second surface of the device, a contact layer, and an electrically insulating layer between the interconnect and contact layers, the interconnect and contact layers being formed of thermally and electrically conductive materials, the interconnect layer comprising extensions that contact a second set of the conductors on the substrate.

2. The electronic assembly according to claim 1, further comprising a heat sink thermally contacting the contact layer.

3. The electronic assembly according to claim 2, further comprising a thermally-conductive lubricant between the heat sink and the contact layer.

4. The electronic assembly according to claim 2, wherein the substrate, the circuit device, the heat-conductive structure, and the heat sink are enclosed within a case, and the heat sink contacts the case.

5. The electronic assembly according to claim 4, wherein the substrate is separated from the case by a thermally-conductive lubricant.

6. The electronic assembly according to claim 4, wherein a portion of the case defines the heat sink.

7. The electronic assembly according to claim 1, wherein the extensions that contact the second set of the conductors are pedestals that are soldered to the second set of conductors on the substrate.

8. The electronic assembly according to claim 1, wherein the heat-conductive structure is layered to consist of two metal regions separated by a nonmetal region, a first of the two metal regions comprising the interconnect layer, a second of the two metal regions comprising the contact layer, the nonmetal region comprising the insulating layer.

9. The electronic assembly according to claim 8, wherein the interconnect and contact layers axe metal films.

10. The electronic assembly according to claim 8, wherein the insulating layer is a ceramic film.

11. An electronic assembly comprising:
   a case;
   a substrate enclosed within the case and having conductors thereon;
   a power semiconductor device mounted to the substrate within the case, the device having oppositely-disposed planar first and second surfaces with circuit elements thereon, the first surface having solder connections registered with a first set of the conductors on the substrate;
   a heat-conductive layered structure having a planar interconnect surface and an oppositely-disposed contact surface, the heat-conductive layered structure comprising a metal interconnect layer that defines the planar interconnect surface of the heat-conductive layered structure, a metal contact layer that defines the contact surface of the heat-conductive layered structure, and an electrically insulating layer between the interconnect and contact layers, the interconnect layer contacting at least some of the circuit elements on the second surface of the device and being formed to have pedestals that are approximately perpendicular to the planar interconnect surface and are soldered to a second set of the conductors on the substrate; and
   a heat sink thermally contacting the contact layer and the case.

12. The electronic assembly according to claim 11, further comprising a thermally-conductive lubricant between the heat sink and the contact layer.

13. The electronic assembly according to claim 11, wherein a portion of the case defines the heat sink.

14. The electronic assembly according to claim 11, wherein the substrate is separated from the case by a thermally-conductive lubricant.

15. The electronic assembly according to claim 11, wherein the heat-conductive layered structure consists of two metal regions separated by a nonmetal region, a first of the two metal regions comprising the interconnect layer, a second of the two metal regions comprising the contact layer, the nonmetal region comprising the insulating layer.

16. The electronic assembly according to claim 11, wherein the interconnect and contact layers are metal films.

17. The electronic assembly according to claim 11, wherein the insulating layer is a ceramic film.

* * * * *